US012656736B2

(12) United States Patent
Manasterski et al.

(10) Patent No.: US 12,656,736 B2
(45) Date of Patent: Jun. 16, 2026

(54) METHOD FOR DEPOSITING A COATING ON AN ITEM, SUCH AS A CLOCKWORK COMPONENT AND ITEM COATED BY SUCH A METHOD

(71) Applicant: The Swatch Group Research and Development Ltd, Marin (CH)

(72) Inventors: Christian Manasterski, Rochefort (CH); Cédric Faure, Cortaillod (CH); Vladislav Spassov, Praz (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 17/494,125

(22) Filed: Oct. 5, 2021

(65) Prior Publication Data

US 2022/0154346 A1 May 19, 2022

(30) Foreign Application Priority Data

Nov. 17, 2020 (EP) ..................................... 20208090

(51) Int. Cl.
| | |
|---|---|
| *C23C 16/00* | (2006.01) |
| *C23C 14/00* | (2006.01) |
| *C23C 14/06* | (2006.01) |
| *C23C 16/40* | (2006.01) |
| *C23C 16/455* | (2006.01) |

(Continued)

(52) U.S. Cl.
CPC .......... *G04B 19/12* (2013.01); *C23C 14/0015* (2013.01); *C23C 14/0635* (2013.01); *C23C 16/006* (2013.01); *C23C 16/403* (2013.01);

*C23C 16/405* (2013.01); *C23C 16/45555* (2013.01); *C23C 28/042* (2013.01)

(58) Field of Classification Search
None
See application file for complete search history.

(56) References Cited

U.S. PATENT DOCUMENTS

| | | | |
|---|---|---|---|
| 5,079,089 A | 1/1992 | Ito et al. | |
| 2007/0275264 A1* | 11/2007 | Hultin .................. | C23C 14/562 |
| | | | 204/192.1 |

(Continued)

FOREIGN PATENT DOCUMENTS

| | | |
|---|---|---|
| CH | 709669 A1 | 11/2015 |
| CH | 715 364 A2 | 3/2020 |

(Continued)

OTHER PUBLICATIONS

Druffel et al., The role of nanoparticles in visible transparent nanocomposites, Aug. 2008, The International Society for Optical Engineering (Year: 2008).*

(Continued)

*Primary Examiner* — Mary I Omori
(74) *Attorney, Agent, or Firm* — Oblon, McClelland, Maier & Neustadt, L.L.P.

(57) ABSTRACT

An item including a substrate and a coating having a colour with an interference effect for the decoration and/or the protection of the item, the coating including: a first opaque layer covering at least partially at least one surface of the substrate; a stack of at least two semi-transparent layers deposited by an ALD method covering the first layer; the stack having a thickness depending on the colour with an interference phenomenon of the coating.

16 Claims, 1 Drawing Sheet

(51) Int. Cl.
  *C23C 28/04*        (2006.01)
  *G04B 19/12*        (2006.01)

(56)         References Cited

U.S. PATENT DOCUMENTS

| | | | |
|---|---|---|---|
| 2008/0160193 A1 | 7/2008 | Mitchell | |
| 2012/0114936 A1 | 5/2012 | Mitchell | |
| 2013/0029174 A1* | 1/2013 | Chiang | C23C 14/0036 |
| | | | 204/192.15 |
| 2018/0217559 A1* | 8/2018 | Furusato | G04B 39/00 |
| 2019/0078209 A1* | 3/2019 | Boccard | C23C 16/403 |
| 2021/0063968 A1* | 3/2021 | Furusato | G04B 45/0015 |
| 2021/0395879 A1* | 12/2021 | Zhang | C23C 14/0036 |

FOREIGN PATENT DOCUMENTS

| | | | | |
|---|---|---|---|---|
| CN | 103852815 B | | 8/2016 | |
| CN | 111778477 A | * 10/2020 | | C23C 14/0015 |
| GB | 2455993 A | * 7/2009 | | C23C 14/0015 |
| JP | 2-133565 A | 5/1990 | | |
| JP | 2002-148358 A | 5/2002 | | |
| JP | 2016-173361 A | 9/2016 | | |
| JP | 2019-53045 A | 4/2019 | | |

OTHER PUBLICATIONS

Mark Podob, Physical Vapor Deposition—Wear-resistant & Decorative Coatings, Nov. 1996, Plating & Surface Finishing (Year: 1996).*

Rusty Townsend, Removing HVOF Coatings: Best Practices for Preserving Substrates, Sep. 2024 (Year: 2024).*

Kuruvila et al., Corrosion measurement of thermally sprayed carbide coatings on stainless steel pipes, Oct. 9, 2024 (Year: 2024).*

European Search Report issued Apr. 20, 2021 in European Application 20208090.9, filed on Nov. 17, 2020, 3 pages (with English Translation of Categories of Cited Documents).

Japanese Office Action issued on Oct. 11, 2022 in Japanese Patent Application No. 2021-175205 (with English translation), 8 pages.

Switzerland Patent Application No. 202111352380.1 filed Aug. 20, 2024 (with English Translation).

Common Knowledge Evidence 1; *Architectural Glass Processing Technology—Glass Coating Technology*, Keming Chen et al., pp. 115-116, South China University of Technology Press, Mar. 31, 2010.

* cited by examiner

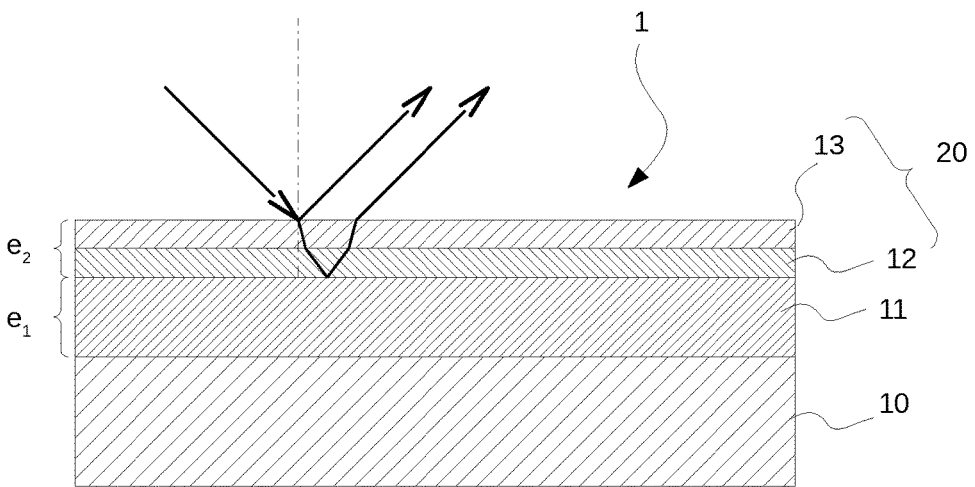
Fig. 1
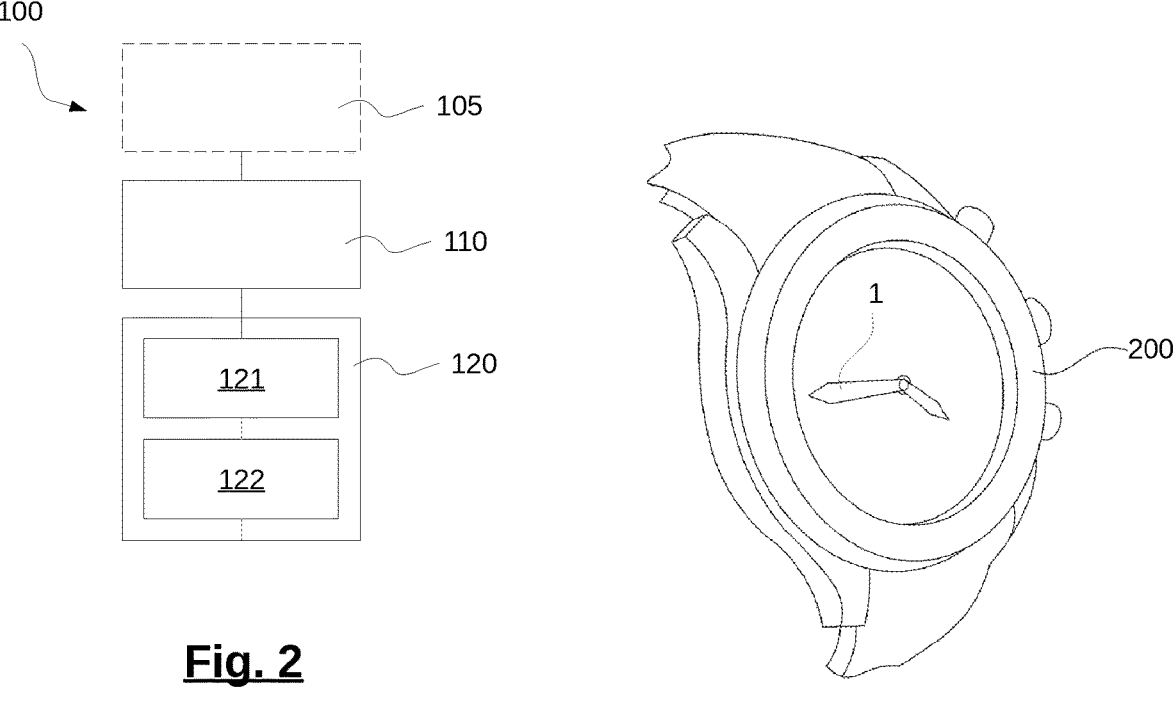
Fig. 2
Fig. 3

METHOD FOR DEPOSITING A COATING ON AN ITEM, SUCH AS A CLOCKWORK COMPONENT AND ITEM COATED BY SUCH A METHOD

CROSS-REFERENCE TO RELATED APPLICATION

This application claims priority to European Patent Application No. 20208090.9 filed on Nov. 17, 2020, the entire disclosure of which is hereby incorporated herein by reference.

TECHNICAL FIELD OF THE INVENTION

The field of the invention relates to the surface treatments of items such as decorative items or clockwork components, and in particular the decorative and/or protective coatings of items.

More particularly, the invention relates to a method for depositing a decorative and/or protective coating making it possible to obtain a coloured coating having an interference effect.

The method for depositing a coating according to the invention is particularly adapted to the protection and/or to the decoration of decorative items or components used in timepieces, such as for example the plates, bridges, trains, screws, oscillating masses, dials, indices, appliques, apertures, hands or any other component of the movement or of the exterior element of a timepiece.

The invention also relates to an item, such as a clockwork component coated by such a method.

TECHNOLOGICAL BACKGROUND

To obtain protective and/or decorative layers on various substrates, it is known to use Physical Vapour Deposition (PVD) techniques.

These PVD methods are used for example to give a distinctive aesthetic aspect to visible elements used in the production of horological products.

For example, it is known to apply coatings by a PVD method on metal parts giving them a shiny or matte aspect according to the initial surface condition, metallic grey, black or coloured according to the method used. However, the palette of colours that can be obtained by these techniques remains limited.

Moreover, it is also known to deposit by PVD methods thin and transparent layers with a thickness comparable to or less than the wavelengths of visible light, which give to the surfaces on which they are deposited a colour attributable to an interference phenomenon, referred to as interference colour.

Such a method makes it possible to obtain various interference colours ranging from dark yellow to green, including tones of violet and blue. However, as previously seen, the palette of colours remains limited and when the parts to be coated are not flat, but of complex geometry, the colour obtained is not uniform, which is not aesthetically satisfactory because the finish is low quality.

It is also known the Atomic Layer Deposition (ALD) technology that is a form of Chemical Vapour Deposition (CVD). This ALD technology is used in horology for the decoration and the corrosion protection of timepieces.

The document "Atomic Layer Deposition (ALD): une technology prometteuse pour l'industrie horlogère", SSC bulletin no. 81, May 2016, particularly describes the possibility of using the ALD technology, in replacement for the PVD technology, for the corrosion protection and for depositing interference colour coatings formed by a single thin transparent layer deposited directly on a reflective substrate.

In comparison with the PVD technology, the ALD technology makes it possible to obtain perfectly uniform layers ensuring a homogeneity of the thickness over the entire periphery of the part, thus giving a uniform colour to the surface of parts with complex geometry. The ALD technology also makes it possible to add colour in the form of interference colours and the properties of the coatings obtained by ALD are particularly suitable for the protection of parts with complex geometry.

However, the ALD technology as described does not make it possible to further extend the palette of interference colours that it is possible to obtain.

The document CH 709 669 proposes to produce a coating for the protection and/or the decoration of a timepiece component comprising a first metal layer deposited by a PVD method and a second semi-transparent layer deposited by an ALD method on top of the first layer, the second semi-transparent layer having a significant thickness making it possible to obtain interference colours in the range of brown, magenta, blue, yellow, orange, violet, green, pink, according to the increasing thickness of the semi-transparent ALD layer.

The document CH 709 669 proposes a solution making it possible to slightly expand the palette of interference colours in relation to documents of the prior art by proposing for the same interference tone, the possibility of obtaining a darker or lighter nuance, and thereof of varying the clarity (i.e. the $L*$ parameter of the $L*a*b$ colour space), depending on the use of a shiny or grey metallic PVD layer under the ALD layer.

However, the current coating methods do not make it possible to obtain an extended palette of interference colours, which limits the decoration possibilities of clockwork components with interference phenomena.

SUMMARY OF THE INVENTION

In this context, the invention aims to propose a method for depositing a decorative and/or protective coating on a substrate free from the limitations of the known and previously described coating methods.

According to the invention, one of the aims of the invention is to propose a method for depositing a decorative and/or protective coating making it possible to obtain a wide range of interference colours in the same tone with variations of similar hues, and particularly a wide range of interference colours in the tone of blues.

To this end, the object of the invention is a method for depositing a decorative and/or protective coating on a substrate for the formation of an item, such as a clockwork component, making it possible to colour said substrate, said deposition method being characterised in that it comprises:

a first step of depositing a first opaque layer on the substrate;

a second step of depositing by an ALD (Atomic Layer Deposition) method a stack of at least two semi-transparent layers covering said first layer; the thickness of the stack being selected in such a way as to obtain a colour with an interference phenomenon.

The formation of an interference colour, or of a colour having an interference phenomenon, is due to the offset between the light reflected by the first opaque layer covering at least partially a surface of the substrate; and that reflected by the stack of semi-transparent layers deposited by an ALD method, covering the opaque layer.

Thus as opposed to the documents of the prior art previously mentioned wherein the colour of the final coating is dependent on the material deposited by a PVD method on the clockwork component, the PVD layer sometimes being able to be coated by a transparent layer deposited by an ALD method in a single aim of protecting the PVD layer, the method according to the invention goes against the prejudices of the prior art since the final colour of the coating is determined by the combination of the opaque layer (preferably deposited by a PVD method) and of the stack of ALD layers that are not transparent but on the contrary semi-transparent in the aim of modifying the L*a*b* parameters of the opaque layer.

Preferably, the first step is a step of depositing a first metal or ceramic layer on said substrate.

Preferably, said first layer is a layer of TiN, TiCN, TiCNO, TiC, ZrN, ZrCN, ZrCNO, ZrC, HfN, HfCN, HfCNO, HfC, YN, YD, YCN, YCNO, TaN, TaC, TaCN, TaCNO, AlN, AlCN, AlCNO, CrN, CrC, CrNO, CrCNO, VN, VC, VCN, VCNO, TiZrN, TiZrCN, TiZrC, TiZrCNO, NbN, NbC, NbCN, NbCNO, WN, WC, WCN, WCNO, MoN, MoC, MoCN, or MoCNO.

Preferably, the chemical nature of said first layer is selected depending on the L* parameter according to the CIELAB standard of said colour with an interference phenomenon of said coating.

Preferably, the first step is performed by a PVD (Physical Vapour Deposition) method.

Preferably, the first layer has a thickness ($e_1$) greater than 450 nm, preferably between 500 nm and 1 μm.

Preferably, said at least two semi-transparent layers of the stack are of different chemical natures and/or have a different refractive index.

Preferably, the thicknesses of each of said at least two semi-transparent layers of the stack are selected depending on the a* and b* parameters, according to the CIELAB standard, of said colour with an interference phenomenon of the coating.

Preferably, said at least two semi-transparent layers of the stack deposited during the second step are layers of a material selected from the dielectric, semi-conductor, metal, or ceramic materials.

Preferably, said at least two semi-transparent layers of the stack deposited during the second step are layers of a material selected from: $Al_2O_3$, $TiO_2$, $SiO_2$, $Ta_2O_5$, $HfO_2$, $ZrO_2$, ZnO, SnO, Al, Ru, Ir, Pt, TiN, TaN, $Si_3N_4$, WN, NbN.

Preferably, a first semi-transparent layer of said at least two semi-transparent layers of the stack has a refractive index less than 2, preferably less than 1.6, and a second semi-transparent layer of said two semi-transparent layers of the stack has a refractive index greater than 2, preferably greater than 2.5.

Another object of the invention is an item including a substrate and a coating having a colour with an interference effect for the decoration and/or the protection of said item, said coating including:

a first opaque layer covering at least partially at least one surface of the substrate;

a stack of at least two semi-transparent layers deposited by an ALD (Atomic Layer Deposition) method covering said at least first layer; the stack having a thickness depending on said colour with an interference phenomenon of said coating.

Preferably, the first layer is a metal layer or a ceramic layer.

Preferably, the first layer is a layer of TiN, TiCN, TiCNO, TiC, ZrN, ZrCN, ZrCNO, ZrC, HfN, HfCN, HfCNO, HfC, YN, YD, YCN, YCNO, TaN, TaC, TaCN, TaCNO, AlN, AlCN, AlCNO, CrN, CrC, CrNO, CrCNO, VN, VC, VCN, VCNO, TiZrN, TiZrCN, TiZrC, TiZrCNO, NbN, NbC, NbCN, NbCNO, WN, WC, WCN, WCNO, MoN, MoC, MoCN, or MoCNO.

Preferably, the chemical nature of said first layer (11) depends on the L* parameter according to the CIELAB standard of said colour with an interference phenomenon of said coating.

Preferably, the first layer is deposited by a PVD (Physical Vapour Deposition) method.

Preferably, the first layer has a thickness $e_1$ greater than 450 nm, preferably between 500 nm and 1 μm.

Preferably, said at least two semi-transparent layers of the stack are of different chemical natures and/or have a different refractive index.

Preferably, the thicknesses of each of said at least two semi-transparent layers of the stack depend on the a* and b* parameters, according to the CIELAB standard, of said colour with an interference phenomenon of the coating.

Preferably, said at least two semi-transparent layers of the stack are layers of a material selected from the dielectric, semi-conductor, metal or ceramic materials.

Preferably, said at least two semi-transparent layers of the stack are layers of a material selected from: $Al_2O_3$, $TiO_2$, $SiO_2$, $Ta_2O_5$, $HfO_2$, $ZrO_2$, ZnO, SnO, Al, Ru, Ir, Pt, TiN, TaN, $Si_3N_4$, WN, NbN.

Preferably, a first semi-transparent layer of said at least two semi-transparent layers of the stack has a refractive index less than 2, preferably less than 1.6, and a second semi-transparent layer of said two semi-transparent layers of the stack has a refractive index greater than 2, preferably greater than 2.5.

Preferably, the item is a clockwork component.

Another object of the invention is a timepiece including a clockwork component.

BRIEF DESCRIPTION OF THE FIGURES

The aims, advantages and features of the present invention will become apparent upon reading the following detailed description making reference to the following figures:

FIG. 1 schematically illustrates an example of multilayer structure of a decorative and/or protective coating according to the invention deposited on a substrate forming an item, such as a clockwork component;

FIG. 2 illustrates the main successive steps of an example of embodiment of the method for depositing a decorative and/or protective coating on a substrate for producing an item, such as a clockwork component, according to the invention;

FIG. 3 illustrates an example of embodiment of an item according to the invention.

DETAILED DESCRIPTION OF THE INVENTION

In the present description, the colorimetric properties of the coating obtained according to the method for depositing a coating according to the invention are expressed with the aid of the CIE L*a*b* colour space and measured according to the standard CIE 1976 on polished samples with a KONICA MINOLTA CM-3610-A spectrophotometer, with the following parameter: CIE D65 light source (daylight 6,500° K), inclination of 10°, SCI measurements (specular reflection included), measuring area of 4 mm of diameter.

A CIELAB colour space (in accordance with the standards CIE no. 15, ISO 7724/1, DIN 5033 Teil 7, ASTM E-1164) has a luminance L* component, representative of the manner in which the material reflects the light, comparable to the clarity, with an a* component that is the green/red component and a b* component that is the blue/yellow component.

FIG. 1 schematically illustrates a sectional view of an item 1, such as a clockwork component, including a substrate 10 as well as a multilayer structure of a decorative and/or protective coating deposited on a substrate by means of the method for depositing a coating according to the invention.

The item 1 is for example a clockwork component, for example a plate, a bridge, a wheel, a screw, an oscillating mass, a dial, an index, an applique, an aperture, a hand or any other component or member of a horological movement or of an external component of a timepiece to which it is desired to give a colour, and particularly an interference colour.

FIG. 3 illustrates a timepiece 200 including an item 1 according to the invention. In this embodiment, the item 1 according to the invention is a hand.

The substrate 10 may be of variable nature, for example made of metal material, made of plastic material or made of ceramic material, or even made of composite material, and may have a variable colour. Thanks to the method according to the invention, it is possible to obtain the same final L*a*b* interference colour with substrates of different nature and/or colour.

The substrate 10 has at least one surface covered at least partially by a first layer 11 deposited by a Physical Vapour Deposition or PVD method, which itself is covered by a stack 20 of at least two semi-transparent layers 12, 13 deposited by an ALD method in such a way as to form a multilayer structure.

The first PVD layer 11 and the two ALD semi-transparent layers 12, 13 may also fully cover the substrate 10, i.e. all of the faces of the substrate 10, or only the visible faces of the substrate 10.

The first layer 11 has an intrinsic colour and has a sufficient thickness $e_1$ so that it is opaque and that the optical disturbance of the substrate 10 is no longer active.

Preferably, the first layer 11 has a thickness $e_1$ equal to or greater than 450 nm, and more preferably a thickness $e_1$ between 500 nm and 1 μm. Thus, it is ensured that the colour of the substrate 10 will not come to optically disturb the L*a*b* colour of the final coating.

The first layer 11 may be a metal layer or a ceramic layer.

Preferably, the first layer 11 is a layer based on ceramic material. The use of a first layer 11 based on ceramic material advantageously makes it possible to be able to extend the palette of possible colours at the first layer 11, in comparison with a first layer based on metal material, the tones of which are limited to yellow, grey, white. Thus, by expanding the palette of colours of the first layer 11, it is possible to increase the palette of interference colours of the final coating by influencing the clarity/brightness of the interference colour (i.e. by influencing the L* parameter).

By way of example, the first layer 11 is a layer based on a ceramic material selected from the group consisting of TiN, TiCN, TiCNO, TiC, ZrN, ZrCN, ZrCNO, ZrC, HfN, HfCN, HfCNO, HfC, YN, YD, YCN, YCNO, TaN, TaC, TaCN, TaCNO, AlN, AlCN, AlCNO, CrN, CrC, CrNO, CrCNO, VN, VC, VCN, VCNO, TiZrN, TiZrCN, TiZrC, TiZrCNO, NbN, NbC, NbCN, NbCNO, WN, WC, WCN, WCNO, MoN, MoC, MoCN, or MoCNO.

Thus, thanks to the use of such ceramic materials, it is possible to obtain a first layer 11 deposited by a PVD method, with a red, orange, yellow, green, blue, violet, pink, brown, black, white or grey tone.

Advantageously, the material of the first layer 11 will be selected in such a way as to have a first layer 11 with a* and b* coordinates close to zero, so that the first layer 11 has a neutral tone without green, red, blue or yellow tendency.

The first layer 11 is covered by a stack 20 of a plurality of semi-transparent layers 12, 13 deposited by an Atomic Layer Deposition or ALD method. In the example of embodiment shown in FIG. 1, the stack 20 includes two semi-transparent layers 12 and 13 thus forming a second layer 12 and a third layer 13 of the multilayer structure of the coating according to the invention.

Of course, the stack 20 deposited by ALD may consist of more than two semi-transparent layers.

The various semi-transparent layers of the stack 20 are advantageously of different chemical natures. In this case, the second layer 12 and the third layer 13 are of different chemical natures.

When the stack 20 includes at least three semi-transparent layers, at least two layers of the stack are of different chemical natures. Advantageously the two layers of different chemical natures are deposited successively.

Preferably, the various semi-transparent layers of the stack have a different refractive index n. In this case, the second layer 12 and the third layer 13 deposited by an ALD method have a different refractive index n.

When the stack 20 includes at least three semi-transparent layers, at least two layers of the stack have a different refractive index n. Advantageously the two layers having a different refractive index n are deposited successively.

Preferably, one of the layers of the stack 20 deposited by ALD, for example the second layer 12, is a low refractive index layer (i.e. less than 2, and preferably less than 1.6) whereas the other layer of the stack ALD, for example the third layer 13, is a high refractive index layer (i.e. greater than 2, and preferably greater than 2.5). Of course, the opposite is also envisaged.

The semi-transparent layers 12 and 13 of the stack 20 may be layers based on dielectric, semi-conductor, metal or ceramic material.

Each of the semi-transparent layers 12, 13 of the stack 20 deposited by an ALD method may be for example an aluminium oxide $Al_2O_3$, a titanium oxide $TiO_2$, a silicon oxide $SiO_2$, a tantalum oxide $Ta_2O_5$, a hafnium oxide $HfO_2$, a zirconium oxide $ZrO_2$, a zinc oxide ZnO, or a tin oxide SnO.

Each of the semi-transparent layers 12, 13 may also be a very thin layer of metal (Al, Ru, Ir, Pt), of ceramic material based on nitride ($Si_3N_4$, WN, NbN, TIN, TaN) or on carbide, as previously mentioned with reference to the first sub-layer 11.

The thickness $e_2$ of the stack 20 is selected depending on the interference colour that it is desired to obtain and so that the thickness $e_2$ is comparable to or less than the wavelength of the desired colour.

Conventionally, to obtain an interference colour, the thickness $e_2$ of the ALD stack is preferably between 50 nm and 200 nm.

FIG. 2 illustrates the main steps of the method for depositing 100 a coating on a substrate 10 according to the invention. Thus, the deposition method 100 according to the invention includes a first step 110 of depositing a first layer 11 performed by a Physical Vapour Deposition (PVD) method.

For example, the first step 110 of depositing a first layer 11 is performed by a sputtering method. The sputtering gas is inert, typically argon. The PVD deposition parameters are determined by the person skilled in the art in such a way as to obtain a satisfactory opacity of the first layer 11 and in such a way that the optical disturbance of the substrate 10 is no longer active.

The method for depositing a coating 100 according to the invention further includes a second deposition step 120 performed by an Atomic Layer Deposition or ALD method, the second step intervening after the first step 110 so that the various atomic layers are deposited by successive stacking on the first layer 11 PVD.

The ALD method is a method for depositing thin atomic layers that form part of Chemical Vapour Depositions, or CVD. It makes it possible from a gaseous precursor, to deposit monoatomic layers that are individually oxidised in order to obtain a continuous oxide layer.

By way of example, it is known to use the precursor trimethylaluminium (TMA, $Al(CH_3)_3$) to obtain layers of $Al_2O_3$, and the precursor tetrakis(dimethylamino)titanium (TDMAT, $C_8H_{24}N_4Ti$) to obtain layers of $TiO_2$.

The second ALD deposition step 120 includes a first sub-step 121 of depositing by an ALD method the second layer 12 previously described and a second sub-step 122 of depositing by an ALD method the third layer 13 previously described, the second layer 12 and the third layer 13 being of different chemical natures and having different refractive indices n.

Of course, this second step 120 of the deposition method 100 according to the invention may include as many substeps of depositing by an ALD method as the stack 20 includes semi-transparent layers.

In addition, the use of a stack 20 of semi-transparent layers 12, 13 of different compositions, successively deposited by an ALD method, makes it possible to be able to combine a plurality of refractive indices within the ALD stack. Such a combination advantageously makes it possible to be able to vary the a* and b* parameters of the L*a*b* colour space, and therefore the hue of the final interference colour however without modifying its tone. Thus, the method according to the invention makes it possible to obtain, for example, various hues of blue with an interference phenomenon by varying the thicknesses of the ALD layers as well as the chemical nature of the ALD layers.

Thus, thanks to the method for depositing 100 a coating according to the invention, it is possible to interact on the L*a*b* colour space of the colour whilst keeping the interference phenomenon sought, by varying the following parameters:

refractive indices n of the semi-transparent layers deposited by ALD, typically of the second layer 12 and of the third layer 13 in the example of embodiment illustrated in FIG. 1;

extinction coefficient k of the ALD semi-transparent layers;

thicknesses of the semi-transparent layers within the stack 20 deposited by ALD;

refractive index n, extinction coefficient k and L*a*b* coordinates of the first layer 11 applied by PVD used as support to the ALD semi-transparent layers, by modifying the composition of the first PVD layer 11.

According to a first example of embodiment, to obtain a coating with a blue interference colour having as L* colour parameter=37.6±1.5, a* colour parameter=−7.5±0.8, and b* colour parameter=−22.3±0.8, the method according to the invention involves depositing a first layer of CrC of 500 nm of thickness by a PVD method, depositing a second layer of $TiO_2$ of 34.8 nm of thickness by an ALD method on the first PVD layer, followed by a third layer of $Al_2O_3$ of 39.3 nm of thickness by an ALD method.

According to a second example of embodiment, to obtain a coating with a blue interference colour having as L* colour parameter=31.6±1.5, a* colour parameter=−7.1±0.8, and b* colour parameter=−22.8±0.8, the method according to the invention involves depositing a first layer of CrC of 500 nm of thickness by a PVD method, depositing a second layer of $TiO_2$ of 41.0 nm of thickness by an ALD method on the first PVD layer, followed by a third layer of $Al_2O_3$ of 25.0 nm of thickness by an ALD method.

According to a third example of embodiment, to obtain a coating with a blue interference colour having as L* colour parameter=32.6±1.5, a* colour parameter=−5.7±0.8, and b* colour parameter=−27±0.8, the method according to the invention involves depositing a first layer of CrC of 500 nm of thickness by a PVD method, depositing a second layer of $Al_2O_3$ of 10 nm of thickness by an ALD method, followed by a third layer of $TiO_2$ of 55 nm of thickness by a ALD method.

Of course, other combinations of materials (other than $Al_2O_3/TiO_2$) may be envisaged to obtain various hues of interference colours.

Thus, it is possible to use and combine various oxides from $Al_2O_3$, $TiO_2$, $SiO_2$, $Ta_2O_5$, $HfO_2$, $ZrO_2$, ZnO, SnO.

The stack 20 may also have three, four or five semi-transparent layers with different refractive indices in such a way as to further increase the palette of possible hues for the same tone of interference colour. However, it will be ensured that the total thickness of the stack 20 does not have a thickness greater than 200 nm in such a way as to obtain a colour with an interference effect.

The various layers of the coating according to the invention, and more particularly the first PVD layer 11 and the stack 20 of ALD layers, typically the second layer 12 and the third layer 13, may be deposited in two separate reactors, or in one single reactor without departing from the scope of the invention.

Prior to the deposition steps 110, 120 previously described, the method 100 according to the invention may also optionally include, a step of preparing 105 the substrate 10.

This preparation step 105 may include a step of cleaning the substrate 10. In a manner known by the person skilled in the art, this cleaning step may be performed for example by chemical cleaning, followed by rinsing with municipal water and with demineralised water. The substrate 10 is then dried and is ready for implementing the deposition steps 110, 120 previously mentioned.

This preparation step 105 may also include an ion activation step. The parameters of the ion activation are determined by the person skilled in the art. The ion activation guarantees the perfect adhesion of the first PVD layer 11 deposited directly on the bare surfaces of the substrate 10.

The method for depositing a decorative and/or protective coating according to the invention has many advantages:

it makes it possible to control the interference colorimetry obtained regardless of the nature of the substrate and of the initial colour of the clockwork component;

the deposition of the coating is performed at low temperature that makes it possible to avoid influencing the crystalline structure of the clockwork component; consequently, the method for depositing a coating according to the invention is applicable to a wide variety of clockwork components;

it makes it possible to adjust with significant ease and good reproducibility the various thicknesses of the layers deposited to the desired value to obtain the desired L*a*b* interference colour;

the thickness of each ALD layer, and therefore the final interference colour of the horological component thus coated, is regular and repeatable.

The invention claimed is:

1. An item, comprising:

a substrate comprising a plastic or ceramic; and a coating having an interference color suitable for decorating and/or protecting the item, wherein the coating comprises:

a first opaque layer of CrC having a thickness in a range of from 500 to 1000 nm, at least partially covering at least one surface of the substrate;

a stack consisting of a first semi-transparent layer of $TiO_2$ having a thickness in a range of from 34.8 to 41.0 nm and a second semi-transparent layer of $Al_2O_3$ having a thickness in a range of from 25.0 to 39.3 nm, wherein, in order, the substrate directly contacts the first opaque layer, the first opaque layer directly contacts the first semi-transparent layer, and the first semi-transparent layer directly contacts the second semi-transparent layer the second semi-transparent layer being an outer layer; and wherein, according to CIELAB standards, the coating has an L* of 37.6±1.5, a* of −7.5±0.8, and b* of −22.3±0.8, or an L* of 31.6±1.5, a* of −7.1±0.8, and b* of −22.8±0.8.

2. The item of claim 1, wherein the first opaque layer is deposited by physical vapor deposition.

3. The item of claim 1, wherein the thickness of the first semi-transparent layer is 34.8 nm, wherein the thickness of the second semi-transparent layer is 39.3 nm, and wherein, according to CIELAB standards, the coating has the L* of 37.6±1.5, a* of −7.5±0.8, and b* of −22.3±0.8.

4. The item of claim 1, wherein the thickness of the first semi-transparent layer is 41.0 nm, wherein the thickness of the second semi-transparent layer is 25.0 nm, and wherein, according to CIELAB standards, the coating has the L* 31.6±1.5, a* of −7.1±0.8, and b* of −22.8±0.8.

5. The item of claim 1, wherein the coating comprises, in this order, vertically from the substrate:

the first opaque layer of CrC;

the first semi-transparent layer of $TiO_2$; and the second semi-transparent layer of $Al_2O_3$, wherein the first opaque layer completely covers the at least one surface of the substrate, and wherein, according to CIELAB standards, the coating has the L* of 37.6±1.5, a* of −7.5±0.8, and b* of −22.3±0.8.

6. The item of claim 1, wherein the coating comprises, in this order, vertically from the substrate:

the first opaque layer of CrC;

the first semi-transparent layer of $TiO_2$; and the second semi-transparent layer of $Al_2O_3$, wherein the first opaque layer completely covers the at least one surface of the substrate, and wherein, according to CIELAB standards, the coating has the L* of 31.6±1.5, a* of −7.1±0.8, and b* of −22.8±0.8.

7. The item of claim 1, wherein the substrate comprises the plastic.

8. The item of claim 1, wherein the substrate comprises the plastic.

9. The item of claim 1, which is a clockwork component.

10. A timepiece, comprising:

the clockwork component of claim 9.

11. An item, comprising:

a substrate comprises a plastic or ceramic; and a coating having an interference color suitable for decorating and/or protecting the item, wherein the coating comprises:

a first opaque layer of CrC having a thickness in a range of from 500 to 1000 nm, at least partially covering at least one surface of the substrate; and a stack consisting of a first semi-transparent layer of $Al_2O_3$ having a thickness of 10 nm and a second semi-transparent layer of $TiO_2$ having a thickness of 55 nm, wherein, in order, the substrate directly contacts the first opaque layer, the first opaque layer directly contacts the first semi-transparent layer, and the first semi-transparent layer directly contacts the second semi-transparent layer, the second semi-transparent layer being an outer layer; and wherein, according to CIELAB standards, the coating has an L* of 32.6±1.5, a* of −5.7±0.8, and b* of −27±0.8.

wherein the first opaque layer completely covers the at least one surface of the substrate.

12. The item of claim 11, wherein the coating comprises, in this order, vertically from the substrate:

the first opaque layer of CrC;

the first semi-transparent layer of $Al_2O_3$; and the second semi-transparent layer of $TiO_2$.

wherein the first opaque layer completely covers the at least one surface of the substrate, and wherein, according to CIELAB standards the coatino has an L* of 32.6±1.5, a* of −5.7±0.8, and b* of −27±0.8.

13. The item of claim 11, wherein the substrate comprises the plastic.

14. The item of claim 11, wherein the substrate comprises the ceramic.

15. The item of claim 11, which is a clockwork component.

16. A timepiece, comprising:

the clockwork component of claim 15.

* * * * *